US009720024B2

(12) United States Patent
Alcouffe et al.

(10) Patent No.: US 9,720,024 B2
(45) Date of Patent: Aug. 1, 2017

(54) SENSOR CIRCUIT, VEHICLE AND METHOD THEREFOR

(71) Applicants: Benoit Alcouffe, Tournefeuille (FR); Sebastien Abaziou, Toulouse (FR)

(72) Inventors: Benoit Alcouffe, Tournefeuille (FR); Sebastien Abaziou, Toulouse (FR)

(73) Assignee: NXP USA, Inc., Austin, TX (US)

( * ) Notice: Subject to any disclaimer, the term of this patent is extended or adjusted under 35 U.S.C. 154(b) by 141 days.

(21) Appl. No.: 14/702,824

(22) Filed: May 4, 2015

(65) Prior Publication Data

US 2016/0154045 A1    Jun. 2, 2016

(30) Foreign Application Priority Data

Dec. 2, 2014    (WO) .................. PCT/IB2014/002911

(51) Int. Cl.
*G01R 31/00*   (2006.01)
*G01P 3/488*   (2006.01)
*G01R 31/02*   (2006.01)
*G01R 31/28*   (2006.01)

(52) U.S. Cl.
CPC ............ *G01R 31/007* (2013.01); *G01P 3/488* (2013.01); *G01R 31/025* (2013.01); *G01R 31/2829* (2013.01)

(58) Field of Classification Search
USPC .................... 324/503, 538, 750.3, 764.01
See application file for complete search history.

(56) References Cited

U.S. PATENT DOCUMENTS

| 5,406,485 | A | 4/1995 | Wise et al. |
| 5,483,817 | A | 1/1996 | Renard et al. |
| 5,510,707 | A | 4/1996 | Caron |
| 7,532,010 | B2 | 5/2009 | Kamel et al. |
| 2003/0030446 | A1 | 2/2003 | Wang et al. |
| 2003/0226702 | A1 | 12/2003 | Imai et al. |
| 2005/0179317 | A1* | 8/2005 | Kosaka .................. G01P 3/489 |
| | | | 303/186 |
| 2010/0286880 | A1* | 11/2010 | Cahill .................. B60T 8/1703 |
| | | | 701/70 |

(Continued)

FOREIGN PATENT DOCUMENTS

CN    103808964 A    5/2014

OTHER PUBLICATIONS

Non Final Office Action for U.S. Appl. No. 14/702,836, mailed Dec. 1, 2016.

(Continued)

*Primary Examiner* — Vincent Q Nguyen
(74) *Attorney, Agent, or Firm* — Charlene R. Jacobsen

(57) ABSTRACT

A sensor circuit includes at least one signal processing circuit connectable to at least one sensor operable on a channel and configured to receive and process a periodic sensor signal therefrom the sensor circuit further includes a switching device coupled between the signal processing circuit and the at least one sensor, at least one switch coupled to the switching device and a controller connected to the at least one switch and to an output of the signal processing circuit. The controller is operable to re-configure the switching device via control of the switch and determine whether a short condition exists on the at least one sensor or channel based on the output from the signal processing circuit.

12 Claims, 8 Drawing Sheets

(56) References Cited

U.S. PATENT DOCUMENTS

2011/0057707 A1     3/2011   Bronczyk et al.
2013/0207665 A1     8/2013   Bandyopadhyay et al.

OTHER PUBLICATIONS

U.S. Appl. No. 14/702,836, filed May 4, 2015, entitled "Sensor Circuit, Vehicle and Method Therefor".
Notice of Allowance for U.S. Appl. No. 14/702,836; 8 pages (Mar. 17, 2017).

* cited by examiner

SENSOR CIRCUIT, VEHICLE AND METHOD THEREFOR

CROSS REFERENCE TO RELATED APPLICATION(S)

The present application claims priority to International Patent Application No. PCT/IB2014/002911, entitled "SENSOR CIRCUIT, VEHICLE AND METHOD THEREFOR," filed on Dec. 2, 2014, and is related to co-pending U.S. patent application Ser. No. 14/702,836, entitled "SENSOR CIRCUIT, VEHICLE AND METHOD THEREFOR," filed on May 4, 2015, the entirety of which are herein incorporated by reference.

FIELD OF THE INVENTION

The field of this invention relates to a sensor circuit, a vehicle and method therefor, and in particular for short circuit detection between wheel-speed sensors and/or channels in an automotive application.

BACKGROUND OF THE INVENTION

Sensor circuits include sensor devices that respond to an input quantity by generating a functionally related output, usually in the form of an electrical or optical signal. A sensor is a device that detects events or changes in quantities and provides a corresponding output, generally as an electrical or optical signal. A sensor device's sensitivity is generally indicative of how much the sensors output changes when the measured quantity changes.

Sensors are used in everyday objects such as touch-sensitive elevator buttons (tactile sensor) and lamps that dim or brighten by touching the base, besides innumerable applications of which most people are never aware. In recent years, the use of sensors has extended beyond the more traditional fields of temperature, pressure or flow measurement, for example into automotive vehicle control systems comprising wheel-speed sensors.

In automotive vehicle control systems, it is known to use wheel speed sensors to obtain and utilise wheel speed information for use in controlling functions, such as, anti-lock brake system (ABS) or traction control. An ABS wheel-speed sensor system measures a speed of a vehicle's wheels and converts an analog sensor signal to a digital signal for processing by an ABS controller. The ABS controller monitors and compares speed information from all four wheels. If the signal from one wheel changes abruptly with respect to the other wheels, the ABS controller understands that the wheel is beginning to lose traction. It then takes the appropriate action by applying the brakes or performing traction control. In such automotive vehicle control systems, each wheel speed sensor has a separate channel for processing the respective wheel speed.

Referring to FIG. 1, U.S. Pat. No. 5,406,485A illustrates a known wheel speed sensor circuit 150 comprising, a wheel speed sensor 18 operably coupled to an instrumentation amplifier 72. The instrumentation amplifier 72 has two input operational amplifiers 74 and 76, wherein each of the operational amplifiers 74 and 76 has one input connected to a respective sensor output lead 28, 29, and an output operational amplifier 78, having inputs coupled to the two input operational amplifiers 74 and 76 and to a positive bias voltage Vref. The output 80 of the output operational amplifier 78 comprises an alternating sensor differential voltage imposed on the voltage Vref, which assures that the output 80 will remain in a positive range.

FIG. 1 also illustrates a voltage divider 84 between Vcc and ground with six intermediate voltage taps. Vcc and the three highest taps are coupled to each of a first pair of analog switches 86 and 88, while the three lowest taps and ground are coupled to each of a second pair of analog switches 90 and 92. Each of the analog switches 86-92 also has two control inputs 94 responsive to control bits stored in registers by a central processing unit (CPU) for selecting which of the input voltages is selected as an output. The outputs of analog switches 86 and 90 provide high and low threshold voltages to a window comparator 96. The window comparator 96 input is the common mode voltage (Vcm) from the instrumentation amplifier 72. The window comparator 96 output signifies a short condition, and is coupled via line 34 to a fault timing and latching circuit 36 and to a disable function of an ND converter 32. The output of analog switch 88 becomes a threshold voltage for a comparator 98 having the sensor high lead voltage on line 28 as its other input. Likewise, the output of analog switch 92 is a threshold voltage for a comparator 100, which has the sensor low voltage on line 29 as its input. An AND gate 102 has inputs coupled to the comparators 98 and 100 and an output to the fault timing circuit 36 for indicating an open circuit condition.

The fault timing circuit 36 has separate timeout settings, both programmable by software, for short and open conditions, and latches a fault when a respective open or short condition exceeds a time limit. The range of selectable timeout periods for a short fault is between 15 and 244 micro-seconds, and the range of timeouts for an open fault is between 4 and 500 milli-seconds. For diagnosing shorts during vehicle operation, the short timeout may be set about 100 micro-seconds.

In operation, the wheel speed sensor 18 is biased by pulling up the sensor output lead 28 to Vcc and pulling down the sensor output lead 29 to ground. If the sensor becomes open circuited, the high lead 28 will transition towards Vcc and the low sensor output lead 29 will transition towards ground and stay there. The lead voltages are monitored by the comparators 98 and 100. When the high sensor output lead 28 voltage transitions above the comparator 98 threshold and the low sensor output lead 29 voltage transitions below the comparator 100 threshold, both comparators turn 'on' to send an open indication to the fault timing circuit 36 via AND gate 102, and the timeout period begins. If the timeout expires, an open circuit fault is latched.

In order to detect a short to ground or a battery, the window comparator 96 compares Vcm to the high and the low thresholds. If either threshold is violated, the output of the window comparator signifies a short condition and the timer for a short condition begins. If the short timeout period expires, a short fault is latched.

Therefore, the sensor circuit 150 is operable to detect a short circuit condition for an individual wheel speed sensor 18, wherein the short circuit condition relates solely to either a short between the wheel speed sensor 18 and ground, or between the wheel speed sensor 18 and a battery. U.S. Pat. No. 5,510,707 and U.S. Pat. No. 7,532,010 also describe techniques to identify a short circuit to ground in a test mode when the vehicle is (and therefore the wheels connected to wheel speed sensors are) at rest.

FIG. 2 illustrates a schematic diagram of a short circuit problem for a wheel speed sensor circuit 200. The wheel speed sensor circuit 200 comprises current amplifiers 202 having first inputs 210 coupled to a supply voltage 212.

Second inputs 216 are operably coupled to the first inputs 210 via resistive element 218, and to first terminals of switching devices 220. Second terminals of the switching device 220 are coupled to second switching devices 222, which in turn are operably coupled to the individual sensors 206, 208 via channels 214 215. In some instances, if the wheel speed is the same, with the same or a low phase difference or a low sensor current difference, the impedance seen across the sensor circuits 240, 242 are the same as the channels are matched, e.g. $Z\_ch1=Z\_ch2$ . . . . In this instance, the current passing through the short 230 is, or approaches, zero, and is unable to be detected.

For safety purposes, particularly in automotive applications, it is desirable to detect all possible faults in all possible operational conditions.

SUMMARY OF THE INVENTION

The present invention provides a sensor circuit, a vehicle that has a moving state in which the sensor circuit operates, and a method for detecting a short circuit in a sensor application, for example a wheel speed sensor application, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Although some examples of the invention have been described with reference to wheel speed sensors in a wheel speed sensor circuit, it is envisaged that this is simply one application that may benefit from the invention. In other example embodiments, the inventive concept may be applied to any sensor circuit comprising a plurality of sensors that requires detection of a short condition between sensors.

Examples of the invention describe a mechanism to actively change the impedance associated with a sensor or channel, for example by controlling the operational mode of a MOSFET to function as a diode. In this manner, if there is no short circuit, the same sensor current without any perturbation is monitored or measured. If there is a determination of a short circuit with the MOSFET configured to function as a diode, a current sensed in the affected channel or from a particular sensor will be affected, e.g. drop to zero, as a result of a large differential impedance between the affected channel and other channels.

Figure 3:
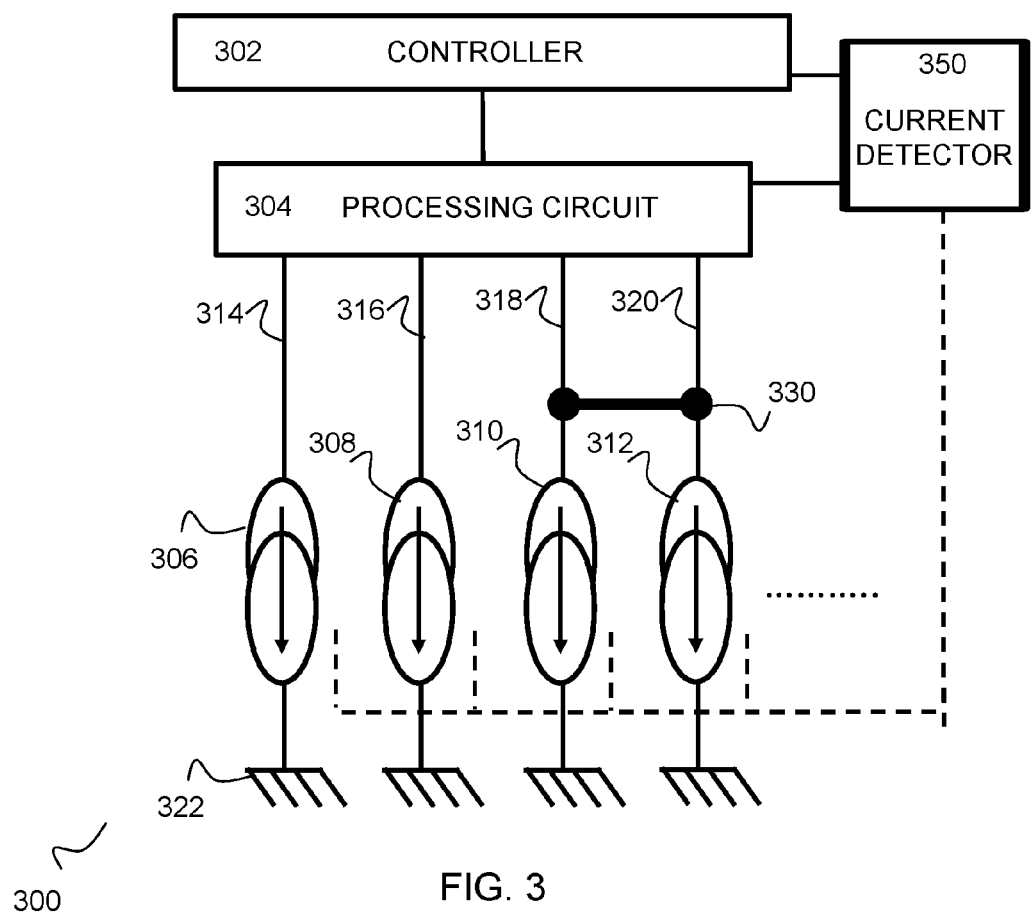
FIG. 3 illustrates an example of a sensing circuit.

Referring to FIG. 3, an example of a sensing circuit 300 illustrates a sensor circuit capable of detecting a short condition between two (or more) sensors and/or two (or more) sensor channels. In this example, the sensing circuit 300 may comprise a controller 302, such as an electronic control unit or control module, operably coupled to (or in some examples housing) a signal processing circuit 304. The signal processing circuit 304 may be operably coupled to a number of individual sensors 306, 308, 310, 312, for example a number of individual wheel speed sensors for a vehicular application. In some examples, the signal processing circuit 304 receives and processes a periodic sensor signal from each of the individual sensors 306, 308, 310, 312. In this example, each individual sensor 306, 308, 310, 312 may be operably coupled to the signal processing circuit 304 via separate channels 314, 316, 318, 320. In this example, each individual sensor 306, 308, 310, 312 may be a hall-effect sensor, for example. In some examples, the signal processing circuit 304 may comprise a number of signal processing circuits or processors, for example one signal processing circuit or processor per individual sensor 306, 308, 310, 312.

In some examples, the controller 302 and/or signal processing circuit 304 and each individual sensor 306, 308, 310, 312 may be operably coupled to a current detector 350, which in some examples may comprise a set of individual current detectors, for example one current detector per individual sensor 306, 308, 310, 312. In some examples, the signal processing circuit 304 or controller 302 may comprise the current detector 350.

As shown in this example, a 'short-circuit' condition 330 (sometimes referred to as a 'short' condition) may occur between at least two of the number of individual sensors 306, 308, 310, 312. In this example, the short condition 330 has been illustrated between the third sensor 310 and fourth sensor 312 and/or may be considered as a short between third channel 318 and fourth channel 320.

In some sensor applications, for example with anti-lock braking systems (ABS) or traction control systems (ESP), it is important to be able to individually interrogate each of the number of individual sensors 306, 308, 310, 312. The short condition 330 that may occur between third sensor 310 and fourth sensor 312 may cause an incorrect value to be decoded by the controller 302 or signal processing circuit 304. Therefore, in some examples, the short condition 330 between third sensor 310 and fourth sensor 312 may cause an error within the sensing circuit 300. A skilled artisan will appreciate that the circuit of FIG. 3 is a diagrammatic representation, and in practice one channel, such as fourth channel 320, could readily develop a short with one or more other channels, and not just the adjacent illustrated third channel 318.

Figure 1:
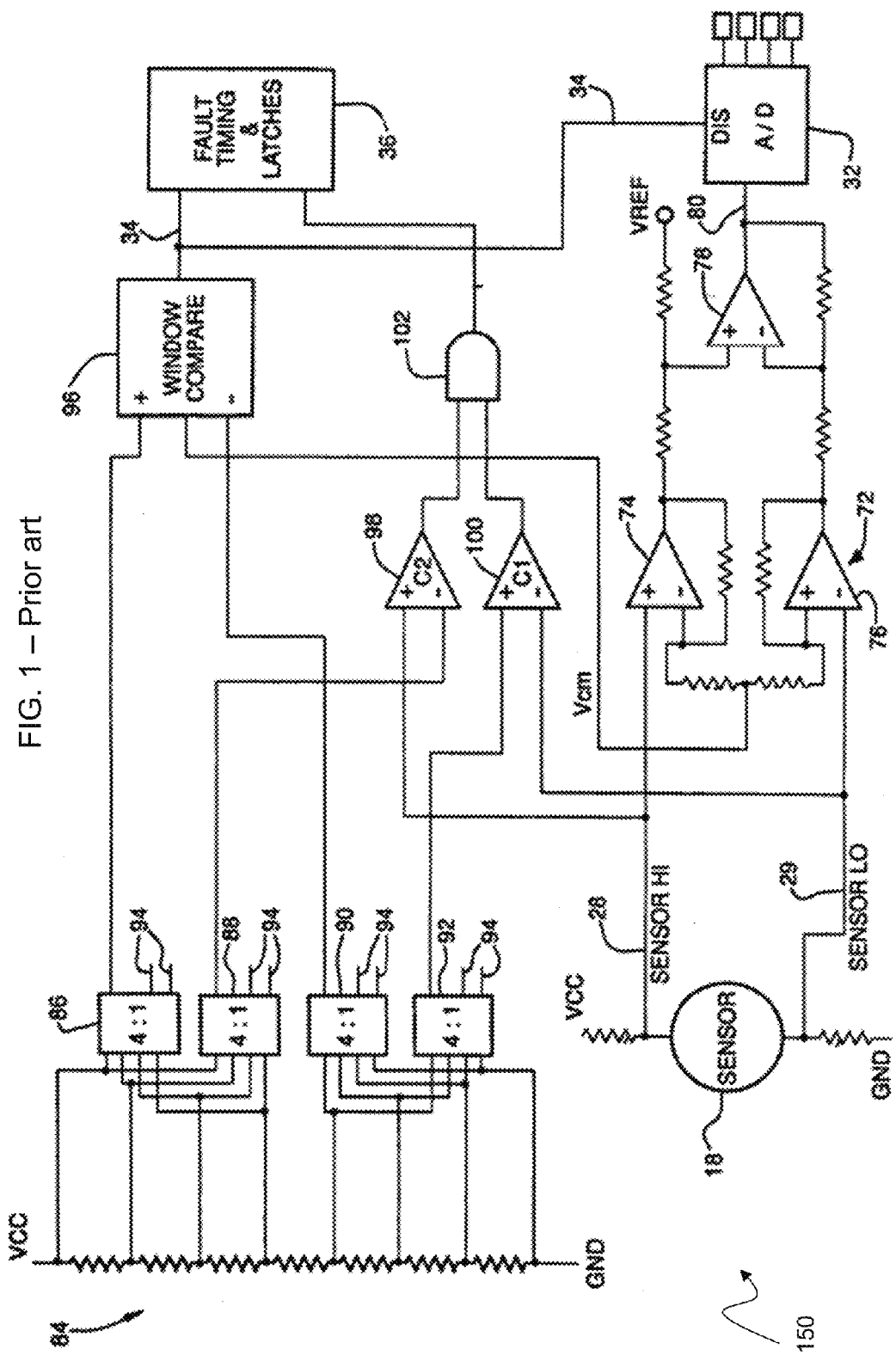
FIG. 1 illustrates a known schematic diagram of a circuit for a wheel speed sensor application.
Figure 2:
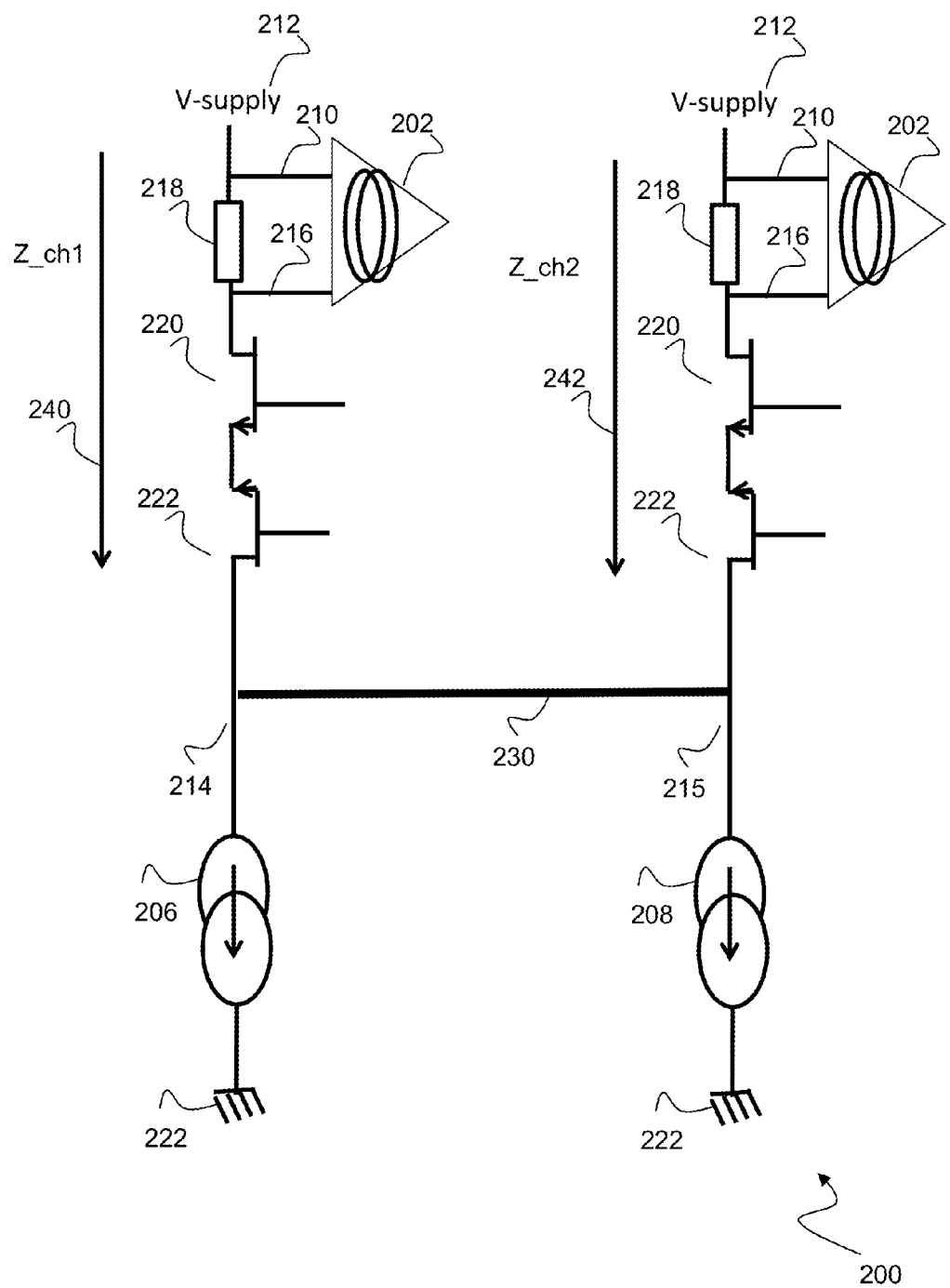
FIG. 2 illustrates a known schematic diagram of a short circuit problem for a wheel speed sensor application.

The inventors have recognised and appreciated that the known prior art sensor circuit, for example the sensor circuit 150 from FIG. 1 and/or sensor circuit 200 from FIG. 2, may be incapable of detecting such a short condition 330, which may occur between at least two separate individual channels and/or between separate individual sensors. This is partly due to prior art sensing circuits only being concerned with detecting short conditions for an individual sensor between the individual sensor and ground, and not 'between' individual sensors and/or channels, and often in a static (i.e. non-mobile) state.

Herein, the detecting of such a short condition between either at least two of the separate individual channels 314, 316, 318, 320 and/or between separate individual sensors 306, 308, 310, 312 are to be viewed interchangeably, inasmuch as a short between sensors or channels will be equally discernible.

In contrast to the known art, examples of sensing circuit 300, and particularly controller 302, are herein described and have been adapted and configured to identify an existence of a 'short-circuit' condition 330 between multiple sensors and/or channels.

In examples of the invention, the sensor circuit 300 may be a wheel speed sensor circuit. Monitoring of the current output from the sensor by the controller may provide an indication that a short exists, if there is a corresponding change in current, or an unbalanced current monitored from one of the sensors, following an imposed circuit impedance change, as described below.

Figure 4:
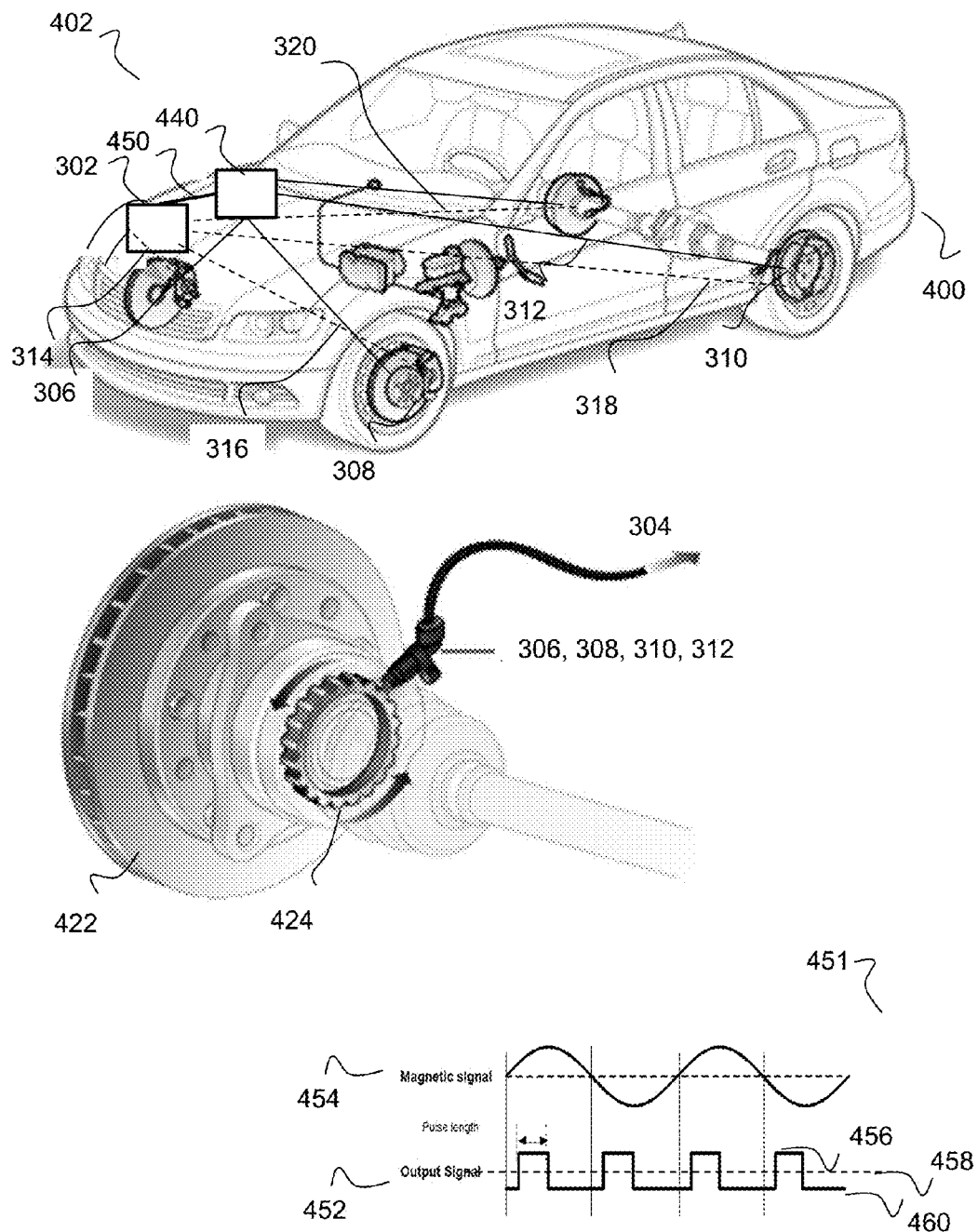
FIG. 4 illustrates an example of a vehicle with a wheel-speed sensor circuit.

FIG. 4 illustrates an example of a vehicle 400 with a wheel-speed sensor circuit 402, for example for use in an anti-lock braking system (ABS). The ABS wheel-speed sensor circuit 402 measures a speed of each of the vehicle's wheels. The example wheel-speed sensor circuit 402 of a vehicle 400 comprises a number of individual sensors 306, 308, 310, 312 operably coupled to controller 302 via separate respective channels 314, 316, 318, 320. The controller 302 is also operably coupled to a modulator 440 via a connection 450.

In operation, the controller 302 monitors and compares speed information from all four wheels via individual sensors 306, 308, 310, 312. If the signal from one wheel changes abruptly with respect to the other wheels, the controller 302 understands that the wheel is beginning to lose traction. The controller 302 can then take the appropriate action by applying pressure to the brakes 422 or traction control via, say, a control signal sent to modulator 440. Thus, in this example, the modulator 440 is also operably coupled to each of the wheels and arranged to control the braking of each wheel according to one or more respective control signal(s) received from controller 302.

In operation, in one example, wheel speed conditioning of signals from active sensors, e.g. individual sensors 306, 308, 310, 312, may be employed by controller 302 in order to determine whether a short condition exists between two sensors or sensor channels.

The digital input signal of an active sensor is a rectangular signal with a variable pulse width. In some examples, in a vehicular application, wheel speed conditioning may output currents of two nominal levels (for example 7 mA or 14 mA for a Type2 sensor) or three nominal levels (7 mA or 14 mA or 28 mA for a Type3 sensor), in a pulsed manner. In some examples, this rectangular signal with a variable pulse width may be interpreted as a digital signal, for example by a digital to analog converter.

Figure 5:
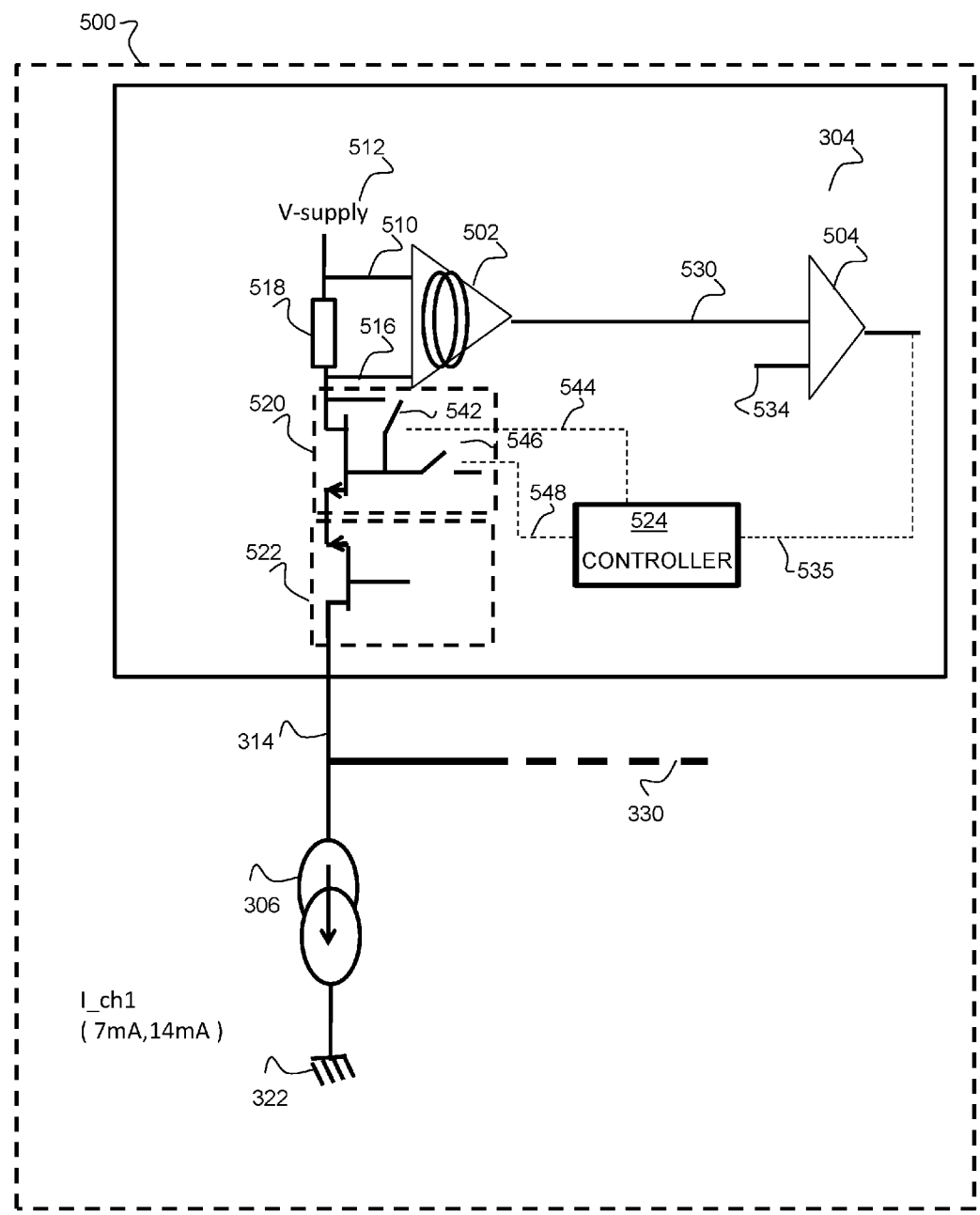
FIG. 5 illustrates a further example of a sensing circuit with examples of signals employed in a wheel-speed sensor circuit on a vehicle.

The example wheel-speed sensor circuit 402 of a vehicle 400 comprises a number of gear-shaped rotors 424 operably coupled to a respective individual sensor 306, 308, 310, 312 located at each wheel. Each gear-shaped rotor 424 spins at a frequency that is substantially proportional (or equal) to a rotation of a wheel attached to the gear-shaped rotor 424. In this example, each individual sensor 306, 308, 310, 312 may comprise a permanent magnet with a coil wrapped around it, which acts as a magnetic pickup that reads a position of the teeth on the gear-shaped rotor 424. When a tooth passes the iron core, the magnetic lines of force cut through the coil windings causing a positive voltage to be induced on the coil. When the tooth is centered on the iron core the magnetic field does not move and zero volts are induced on the coil. As the tooth moves away from the iron core the magnetic field expands, resulting in a negative voltage. An outcome of this effect, in one example, is an alternating current pattern (or voltage signal) as shown in FIG. 5. As the rotation speed of the gear-shaped rotor 424 increases, the voltage and frequency of the signal also increases, thereby indicating a faster wheel speed to the controller 302.

Thus, in this example, each of the number of individual sensors 306, 308, 310, 312 may be operable to generate a current waveform that is representative of a position of a toothed wheel operably coupled to a wheel of a moving vehicle, as illustrated in FIG. 5. In some other examples, at least two of the sensors, for example individual sensors 306, 308, may be utilised, for example for a two-wheel drive vehicle. In some other examples, more than four sensors (and therefore channels) may be utilised, for example for a lorry or truck with more than four wheels.

FIG. 4 also illustrates an example of signals 451 employed in a wheel-speed sensor circuit on a vehicle, for example vehicle 400. If the wheel of a vehicle is in motion, the position of the teeth of the toothed wheel, coupled to the wheel of the moving vehicle and relative to one of the individual sensors, such as individual sensors 306, 308, 310, 312, change. Therefore, as each tooth passes one of the individual sensors 306, 308, 310, 312, a current frame may be generated, thereby resulting in a rectangular wave output 452, wherein each edge of the rectangular wave signal represents a tooth edge on, say, the gear-shaped rotor 424. Thus, in some examples, a period of the rectangular wave output may be utilised to determine a wheel speed of the vehicle.

In this example, each individual sensor 306, 308, 310, 312 converts the magnetic signal 454 into a rectangular pulse signal 452 at a frequency according to the respective wheel speed. In this example, at each HIGH pulse 456, the individual sensor 306, 308, 310, 312 draws 14 mA from a vehicle battery, whereas in an output LOW state 460 7 mA is drawn. The controller, for example controller 302 from FIG. 3, compares these current levels to, say a threshold level of, say, 10 mA 458 in order to determine whether the output signal is a HIGH pulse 456 or in a LOW state 410. In some examples, the threshold level(s) may be internally generated by the controller 302.

In one example a 10 mA threshold may be employed for a Type2 sensor. In one example a 20 mA threshold may be employed for a Type3 sensor. In some examples, the controller 302 may determine a duty cycle (period) associated with the rectangular signal that is output from the sensor. In this manner, if a sensor output current is determined as being above or below the threshold for a specific period of time, the sensor output current may be deemed to be a high pulse or a respective low pulse.

In some examples, in addition to vehicle speed, other information may be transmitted by the controller 302, for example dependent upon the type of sensor employed. For example, the sensors may be:
  (i) a Type1 sensor may transmit only wheel speed information, without coding and with an output signal having a 50% duty cycle and varying between 7 mA to 14 mA;
  (ii) a Type2: sensor may transmit only wheel speed, direction and fault mode; information using pulse width modulated (PWM) encoded information and an output signal with a variable duty cycle and varying between 7 mA to 14 mA; and
  (iii) a Type3 sensor may transmit using pulse encoded information (e.g. Manchester coding), with an output signal of multiple pulses (say, a maximum number of nine pulses varying between 7 mA to 28 mA.

In one example, for say the Type2 sensor, each zero crossing of magnetic signal 404 may trigger an output pulse within output signal 452. In addition to indicating a speed of motion of a vehicle, further information may be provided by varying a length of the output pulse. For example, each duty cycle of a Type2 sensor and, say, the Manchester code of a Type3 sensor may be used to represent a wheel direction and one or more fault modes of each wheel that the sensor is coupled to.

Referring to FIG. 5, an example of a sensing circuit 500 is illustrated. In this example, the sensing circuit 500 may be employed in a vehicle, such as vehicle 400 from FIG. 4, as a wheel speed sensor circuit. In this example, part of a single sensing circuit 500 may be operably coupled to an individual sensor, for example individual sensor 306 via channel 314 of FIG. 3. In some examples, the vehicle may comprise multiple similar sensing circuits 500 coupled to other individual sensors, for example via other channels (not shown). Thus, in this wheel speed sensor example, a similar sensing circuit 500 may be utilised for each of the other number of individual sensors 308, 310, 312 from FIG. 3, for example.

In this example, the sensing circuit 500 may comprise a current amplifier, for example a current amplifier 502, operably coupled at its output to an input of a comparator 504. A first input 510 of the current amplifier 502 is operably coupled to a supply voltage 512. A second input 516 of the current amplifier 502 is operably coupled to the first input 510 via a resistive element 518, and to a first terminal of a switching device 520. In some examples, the switching device 520 may be a semiconductor switching device, for example a metal oxide semiconductor field effect transistor (MOSFET) or a FET, for example. A second terminal of the switching device 520 may be operably coupled to a first terminal of a second switching device 522, which in some examples may be a similar device to switching device 520. A second terminal of the second switching device 522 is operably coupled to the individual sensor 306 via channel 314, wherein the individual sensor 306 may be further coupled to ground 322.

In some examples, the comparator 504 additionally comprises a threshold input 534, which for this example may be configured to be around 10 mA. In this manner, the comparator 504 is able to compare the rectangular wave output with the threshold level of 10 mA and determine whether the output signal is a HIGH pulse (e.g. with a high current level of 14 mA), or in a LOW state (e.g. with a low current level of 7 mA).

In this example, a controller 524 may be configured to control the functionality of switching device 520 via control signals 544 and 548 applied to respective first and second switches 542, 546. In this example, first switch 542 is positioned between the gate and drain of the switching device 520 and second switch 546 is coupled to the drain of switching device 520.

In a first example normal mode of operation, which may be an operational (e.g. moving vehicle) mode of operation, the controller 524 may open first switch 542 and close second switch 546 via control signals 544 and 548, thereby allowing a supply current from the voltage supply 512 to be coupled to the individual sensor 306. In this example normal mode of operation, the switching device 520 and second switching device 522 are 'ON' and the individual sensor 306 will generate a toothed wheel current, e.g. rectangular wave similar to output 452 of FIG. 4.

The impedance in channel 314 may be determined as Zr (impedance from resistive element 518), Zds_520 (drain source impedance from the switching device 520) and Zds_522 (drain source impedance from the second switching device 522). Therefore, the impedance of channel 314 in this mode of operation may be defined as:

$$Z_{Total(460)} = Z_R + Z_{DS\_520} + Z_{DS\_522} \qquad [1]$$

During normal operation of the individual sensor 306, a short condition, for example short condition 330, may occur between the channel 314 and another channel within the system, for example channel 316, 318 or 320 from FIG. 3.

As the wheels of the vehicle generally rotate with the same speed and usually have the same, or similar, phase characteristic, a similar rectangular wave output may be output by the individual sensor 306 and at least one other sensor(s), 308, 310 or 312 that is now coupled to the individual sensor 306 via the short condition 330. Further, channel 314, and at least one other channel(s) 316, 318, 320, within the system may be impedance matched by design and/or construction. Therefore, in this instance, following a short condition 330, current may not flow across the short, making detection of the short condition 330 difficult.

Therefore, in some examples, the impedance of sensing circuit 500 may be altered compared to other sensing circuits within the vehicle 400, for example sensing currents on additional wheels within the vehicle 400.

In one example, which may for example be a test mode of operation, the controller 524 may re-configure switching device 520 to function substantially as a diode. The re-configuring of switching device 520 may be achieved by closing first switch 542 via control signal 544 and opening second switch 546 via control signal 548. In this manner, the gate and drain of the switching device 520 are coupled together, thereby performing a diode function. In this example, the anode of the diode is operably coupled to resistive element 518 and the cathode of the diode is operably coupled to the first terminal of the second switching device 522. In this example, the total impedance in channel 314 changes due to re-configuring switching device 524.

For example, the impedance in channel 314 may now be determined as Zr (impedance from resistive element 518), Zdiode_520 (diode impedance from coupling the gate and drain of switching device 520) and Zds_522 (drain source impedance from the switching device 522). Consequently, the impedance of channel 314, in this example test mode of operation, may be defined as:

$$Z_{Total\_diode(570)} = Z_R + Z_{Diode\_520} + Z_{DS\_522} \qquad [2]$$

Therefore, in this example test mode, the impedance of channel 314 has been altered compared to the impedance of other channels 316, 318, 320. Following a short condition 330, there will now be an un-equal impedance between channel 314 and at least one other channel. Hence, a (different) current may flow through the short, equal to the current flowing in channel 314 and the current flowing in the other (coupled-to) channel.

As well as changing the total impedance on channel 314 by re-configuring switching device 520 to function as a diode, there is also an introduction of a diode threshold voltage to overcome before a current can be received by the comparator 504. In a normal mode of operation, the rectangular wave output from the individual sensor 306 is amplified via current amplifier 502 and coupled via line 530 to the comparator 504. However, during the test mode of operation, the voltage across the re-configured switching device 520 functioning as a diode must be met or exceeded in order for the rectangular wave output to be received by the comparator 504 via line 530. In some examples, the threshold of the re-configured switching device 520 functioning as a diode may be around 1 volt. Therefore, in order to meet or exceed this diode threshold voltage, the current and impedance in channel 314 must be maintained at a sufficient level.

In some examples, the rectangular wave output may range from 7 mA to 14 mA. Further, in some examples, the short condition 330 may provide current from another channel, which may also be in the range of 7 mA to 14 mA. Therefore, potentially, there may be a total of 28 mA (14 mA+14 mA) applied to current amplifier 502.

In this test mode of operation, the impedance $Z_{channel\_diode}$, of channel 314, if there is a short condition 330, is combined with the impedance, $Z_{total}$, from the other (coupled-to) channel. It should be noted that only one switching device, of a set of switching devices coupled to respective sensors, is re-configured to function as a diode channel at any particular instant of time, as described with reference to FIG. 8.

In this manner, re-configuring a single switching device 520 to function as a diode may allow a short condition 330 to be detected.

In some examples, the controller 524 may receive an indication 535, for example an indication as to whether the output from the comparator 504 is a toggling square wave, as expected, or a sustained logic '0' that would indicate a short condition.

Hence, in a test mode, when the switching device 520 is re-configured to perform a diode function, and there is not a short condition, the voltage, in channel 314 is defined by the total impedance multiplied by the current. Thus, the total impedance, given by $Z_{Total\_diode\ (570)}$, multiplied by the current (which may vary between 7 mA and 14 mA) may provide enough voltage to meet or overcome the diode's threshold voltage. This will, therefore, allow the rectangular wave output to be amplified by the current amplifier 502 and received and identified as a square wave output by the comparator 504 through comparison of the input signal on line 530 with the reference current 534.

However, if there is a short condition 330 between the channel 314 and another channel 316, 318, 320, for example, the total current (which may be up to 28 mA), and the total impedance of $Z_{Total\_SHORT}$, which is now reduced, will not provide enough voltage to overcome the diode's threshold. Therefore, the comparator 504 will not receive the rectangular wave output from current amplifier 502. As a result, the controller 524, configured to monitor the output of comparator 504, recognises that a sustained logic '0' (perhaps output via line 535) indicates that a short condition 330 has occurred. When controller 524 receives or monitors a square wave output from comparator 504, the controller assumes that there is no short condition 330.

Figure 6:
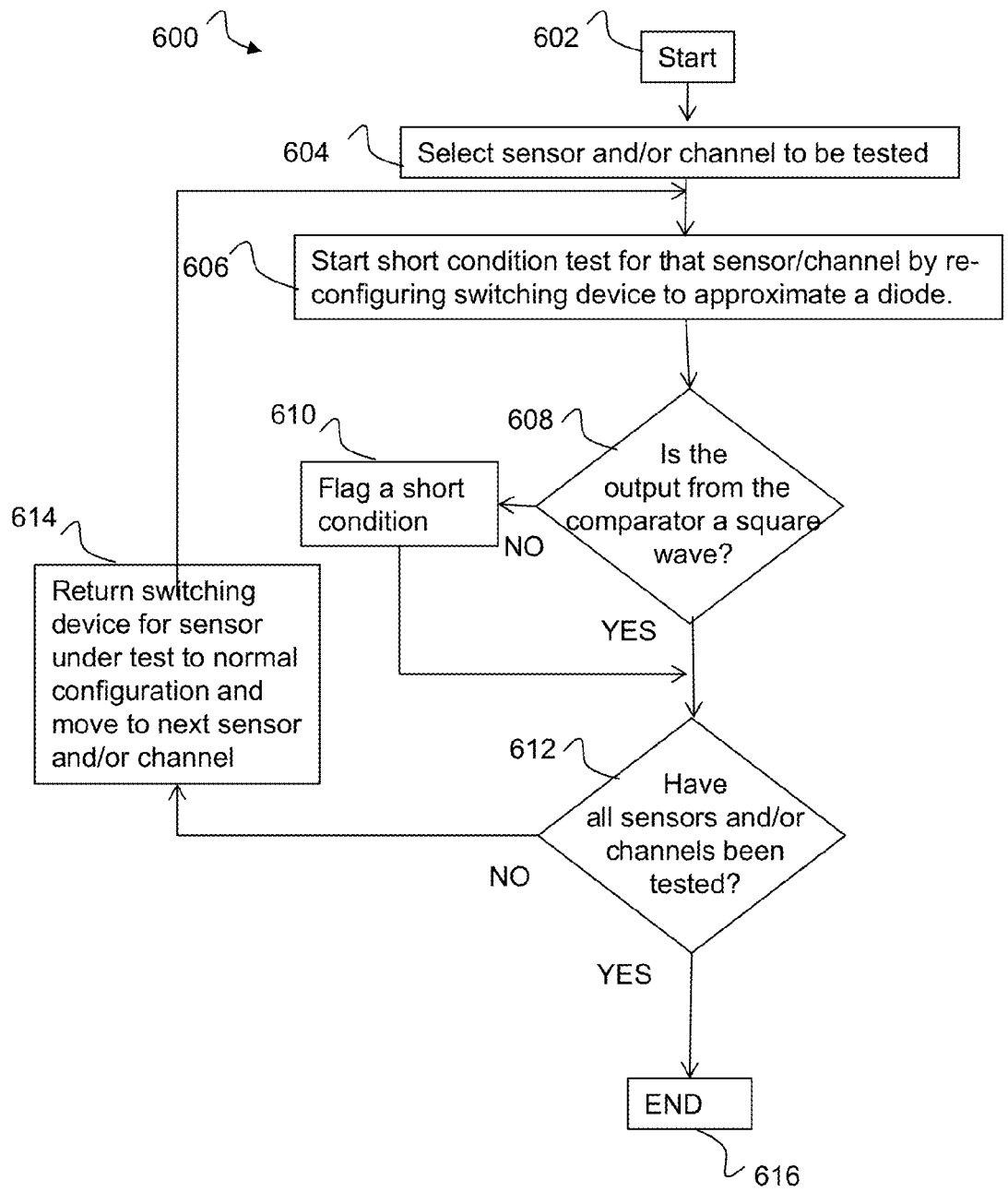
FIG. 6 illustrates an example flowchart of the operation of the sensing circuit of FIG. 5.

Referring to FIG. 6, a flow chart 600 illustrates an example operation of the sensing circuit of FIG. 5, according to some examples of the invention. The flow chart 600 illustrated in FIG. 6 may be utilised with any number of sensors and/or channels. However, for explanatory purposes, a four sensor-four channel system has been described. It should, however, be clear to a skilled person that the examples of the invention may be applied to a sensing circuit comprising any number of individual sensors and/or channels.

In this example flowchart, a determination of whether or not a short condition may exist is made based on whether a rectangular wave is output from the comparator 504 of FIG. 5.

The example operation commences at 602. At 604, a first sensor and/or channel, for example individual sensor 306 and/or channel 314 of FIG. 5, may be selected for testing. At 606, an associated switching device, for example switching device 520 of FIG. 5, may be re-configured to perform a diode function. At 608, a controller may then receive or monitor an output from the comparator and determine therefrom whether a short condition exists. For example, the controller may receive or identify a rectangular wave output if no short condition exists, and a sustained logic '0' from the comparator if a short condition exists. Therefore, in this example, if a short condition exists at 608, this is flagged at 610. Following 608, or 610, a determination is made as to whether all sensors/channels have been tested in 612. If all sensors/channels have not been tested in 612, the switching device (e.g. switching device 520) is returned to its normal operating mode and a next sensor and/or channel is selected at 614 and the process loops to 606. Otherwise, if all sensors/channels have been tested in 612, the operation ends at 616.

In this example, following a short condition test mode of operation being performed for the first sensor and/or channel, the above mentioned procedure may be repeated sequentially for remaining sensor and or/channels. As a result, if two individually tested sensors and/or channels both indicate a short condition, it can be implied that the short condition is present between these two sensors.

Therefore, in this example, by interrogating each channel and/or sensor systematically, a short condition between at least two channels can be found utilising some examples of the invention. In some examples, flagging a single short condition 610 may result in the controller 524 shutting down, or putting ESP/ABS into a safe mode of operation. In some other examples, after flagging a single short condition 610, the system may attempt to determine where the short condition resides within the system, for example determining which further channels and/or sensors are involved in the short condition, before the system shuts down.

In some examples, performing some or all of the above mentioned method may allow checking for a short condition between every sensor and/or channel, in accordance with Table 1 below.

TABLE 1

| Channel-1 | Channel-2 | Channel-3 | Channel-4 | Short? |
|---|---|---|---|---|
| MOS controlled in diode | MOS controlled ON | MOS controlled ON | MOS controlled ON | Detect whether Channel-1 short to other channels (ch2, ch3, ch4) |
| Channel-1 | Channel-2 | Channel-3 | Channel-4 | |
| MOS controlled ON | MOS controlled in diode | MOS controlled ON | MOS controlled ON | Detect whether Channel-2 short to other channels (ch1, ch3, ch4) |
| Channel-1 | Channel-2 | Channel-3 | Channel-4 | |
| MOS controlled ON | MOS controlled ON | MOS controlled in diode | MOS controlled ON | Detect whether Channel-3 short to other channels (ch1, ch2, ch4) |

Figure 7:
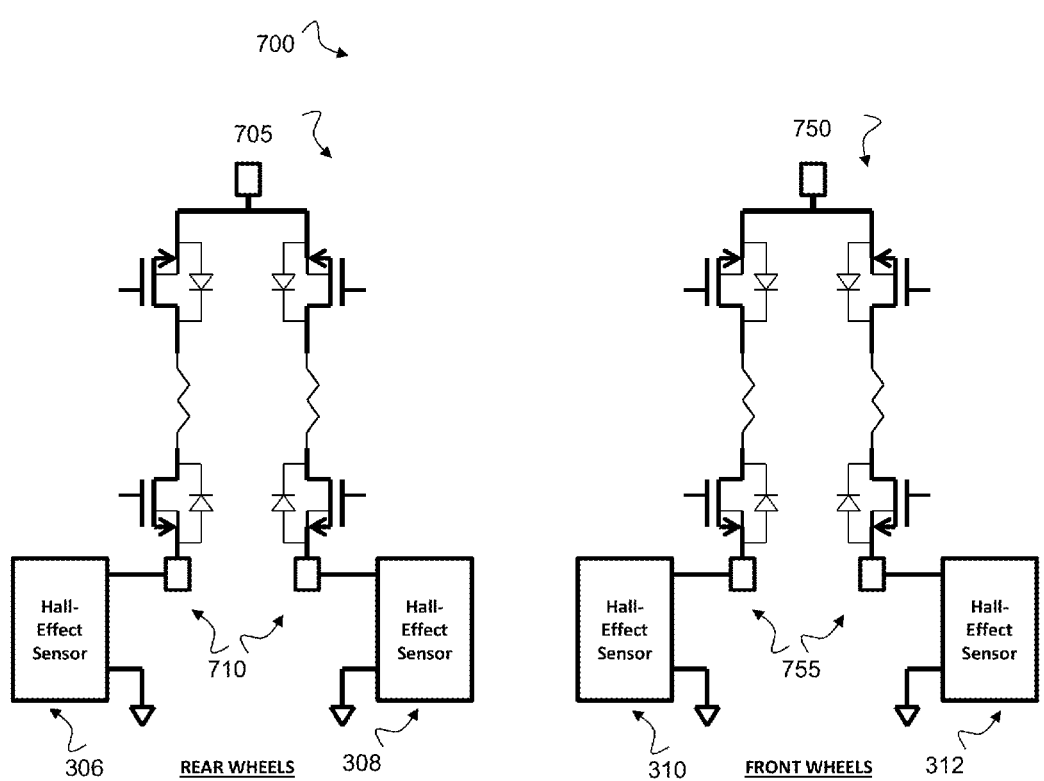
FIG. 7 illustrates an example of a vehicle with four wheel-speed sensor circuits with front and rear sub-modules.

FIG. 7 illustrates an example of a vehicle with four wheel-speed sensor circuits 700 with rear wheel sub-modules 705 and front wheel sub-modules 750. In this example, the wheel-speed sensor, and therefore the respective independent wheel-speed determinations, are implemented in two independent sub-modules (front/rear wheels), where each sub-module contains a dual analog sensor interface 710, 755. For failsafe purposes, the sensor interfaces 710 supporting the rear wheels are routed independently of the sensor interfaces 755 supporting the front wheels. In one example, all supplies, grounds, circuit biases, clocks and resets for these interface pairs may be routed independently, to avoid any undesirable performance effect from another sub-module or part thereof.

In some examples, therefore, the at least two sets of signal processing circuits for processing the sensor signal may be coupled to sensors 306, 308. In another example, the at least two sets of signal processing circuits for processing the sensor signal may be coupled to sensors 310, 312. In another example, the at least two sets of signal processing circuits for processing the sensor signal may be coupled to one sensor coupled to a rear wheel and one sensor coupled to a front wheel.

Figure 8:
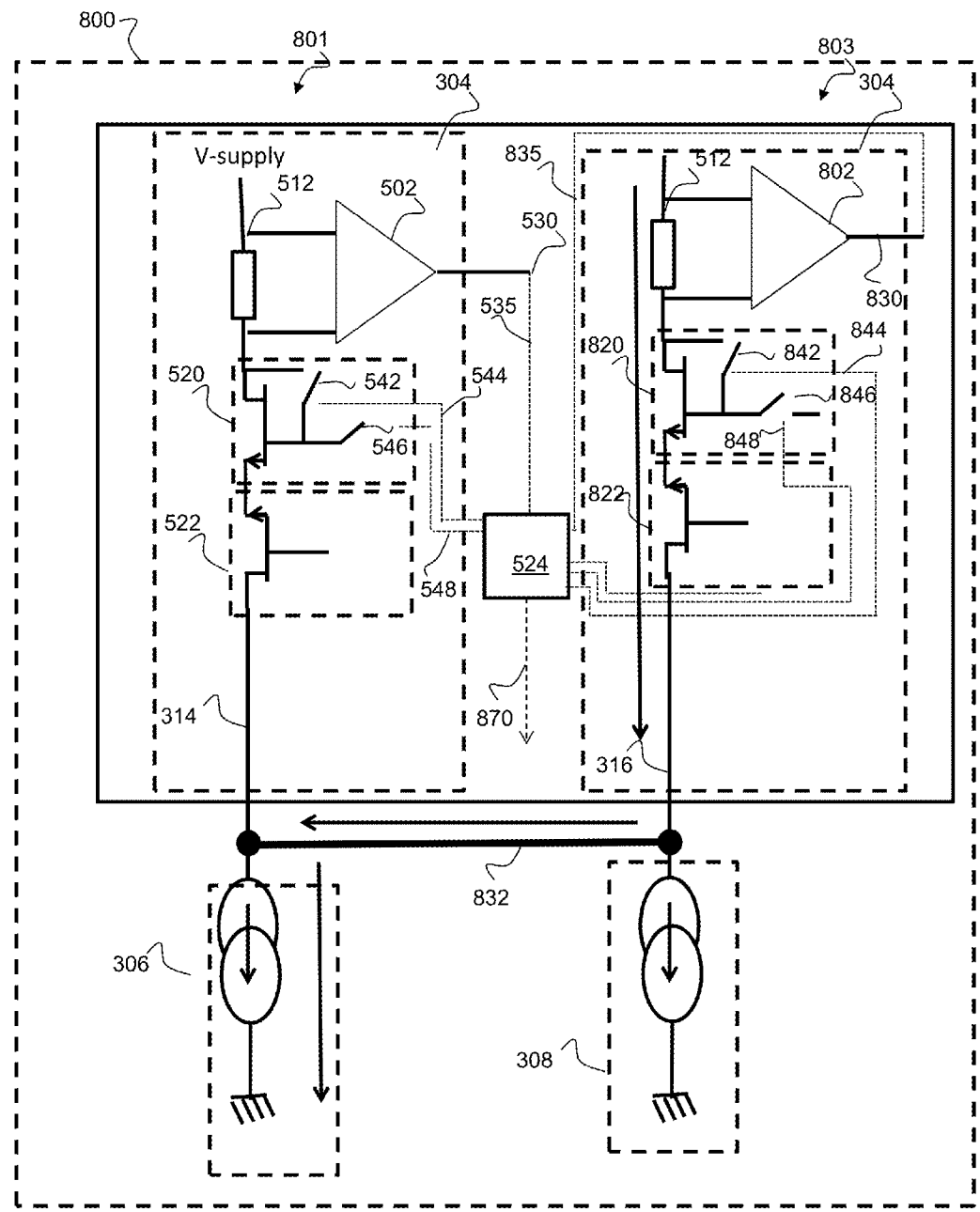
FIG. 8 illustrates a yet further example of a sensing circuit.

Referring to FIG. 8, a yet further example of a sensing circuit 800 is illustrated. In this example, the sensing circuit 800 may be employed in a vehicle, such as vehicle 400 from FIG. 4, as a wheel speed sensor circuit. In this example, a simplified schematic diagram 801 of the circuit of FIG. 5 has been incorporated with a second simplified schematic diagram 803 illustrating a further simplified sensing circuit comprising a further individual sensor and associated circuitry, the functionality of which will not be repeated herewith for the sake of clarity. Therefore, in this example, a second sensor 308 may be operably coupled via channel 316 to a third switching device 820 and a fourth switching device 822.

In this example, a controller 524 may be configured to control the functionality of third switching device 820 via control signals 844 and 848 applied to respective first and second switches 842, 846. In this example, first switch 842 is positioned between the gate and drain of the switching device 820 and second switch 846 is coupled to the drain of switching device 820.

In this example, the controller 524 is configured to monitor the outputs of the current amplifiers 502, 802. In other examples, controller 524 may be configured to monitor (or receive) the outputs of comparators, in accordance with FIG. 5.

Further connections 870 to carry control signals such as 544, 548, 844, 848 from controller 524 may be applied to further switches coupled to switching devices (not shown) coupled to other sensors and/or channels, within the vehicle 400.

In some examples, it may be necessary to not only determine that a short condition exists, but to also determine the relevant sensors and/or channels connected to the short condition. In some examples, the controller 524 may receive an indication 535, 835 from respective current amplifiers 502, 802, indicating a sustained logic '0' or a square wave and therefore whether a short condition 832 exists.

In an example operation, which may be during a running mode of the vehicle 400, the controller 524 may determine that the sensing circuit 800 should be checked for a short condition. In this example, only two sensors 306, 308 and channels 314, 316 have been illustrated for clarity.

Initially, the sensing circuit 800 may be operating normally, for example switching devices 520, 522, 820 and 822 may all be configured to be 'ON', thereby allowing current to flow between Vsupply 512 and ground. Thus, in this first normal mode of operation, which may be an operational (e.g. moving vehicle) mode of operation, the controller 524 may open first switches 542, 842 and close second switches 546, 846 via control signals 544, 844 and 548, 848 respectively, thereby allowing a supply current from the voltage supply 512 to be coupled to the individual sensors 306, 308. In this example normal mode of operation, the switching device 520, 820 and second switching devices 522, 822 are 'ON' and the individual sensor 306 will generate a toothed wheel current, e.g. rectangular wave output 452 of FIG. 4.

During normal operation, a short condition, for example short condition 832, may occur between the channel 314 and channel 316, or between sensor 306 and sensor 308, within the system.

As the wheels of the vehicle 400 generally rotate with the same speed and usually have the same, or similar, phase characteristic, a similar rectangular wave output may be output by the individual sensor 308, which is now coupled to the individual sensor 306 via the short condition 832. Further, channel 314, and channel 316 may be impedance matched by design and/or construction. Therefore, in this instance, following a short condition 832, current may not flow between the short, making detection of the short condition 832 difficult.

Therefore, in some examples, the impedance of sensing circuit 800 may be altered compared to other sensing circuits within the vehicle 400, for example sensing currents output by sensors attached to different wheels on the vehicle 400.

In one example, which may for example be a test mode of operation, the controller 524 may re-configure switching device 520 to function substantially as a diode. The re-configuring of switching device 520 may be achieved by closing first switch 542 via control signal 544 and opening second switch 546 via control signal 548. In this manner, the gate and drain of the switching device 520 are coupled together, thereby performing a diode function. In this example, the anode of the diode is operably coupled to resistive element 518 and the cathode of the diode is operably coupled to the first terminal of the second switching device 522. In this example, the total impedance in channel 314 changes due to re-configuring switching device 524.

Therefore, in this example test mode, the impedance of channel 314 has been altered compared to the impedance of other channels. Following a short condition 832, there will now be un-equal impedance between channel 314 and at least one other channel, e.g. channel 316. Hence, a different current flows through the short, equal to the current flowing in channel 314 and the current flowing in channel 316. In some examples, the controller 524 is able to detect an increase in current due to the short condition 832. For example, by knowing that the impedances of individual sensor 306 and individual sensor 308 are infinite, then the impedance (z_ch1−z_ch2) between first channel 314 and second channel 316 may be defined as:

$$Z\_ch1 - Z\_ch2 = z\_522 + z\_520\_z\_512 - z\_822 + z\_820 + z\_512 \quad [3]$$

In a first case, where there is a short condition 832 and the impedance (z_ch1) in first channel 314 is the same as the impedance (z_ch2) in second channel 316, then the sensor current in each of individual sensors 306, 308 is the same (or substantially the same). In this first case, the short is not detectable, even if z_short=0.

In a second case, where there is a short condition 832, a change is effected to change one switching device (say switching device 520) in a first path of one of the signal processing circuits 304 to function as a diode. As such, it is now possible to differentiate between the impedance (z_ch1) in first channel 314 and the impedance (z_ch2) in second channel 316, as the path with the switching device configured as a diode is high impedance (e.g. ZR+ZDiode_520+ZDS_522=infinite), whereas the voltage z_ch2×I sensor is <1 diode's threshold.

In some examples, such a control of the voltage in channel 314 in a test mode may take into account a potential total current of 28 mA of current due to the short condition 330. Therefore, in one example, the selection of component values may be such that a voltage developed across the switching device, re-configured to function as a diode, is arranged to be less than the diode's threshold voltage:

$$(ZR + ZDS\_520 + ZDS\_522) \times 28 \text{ mA is} < 1 \text{ diode's threshold} = \sim 0.6 \text{ v/1 v.} \quad [4]$$

The examples that enable the controller 520 to factor in the threshold voltages of the re-configured switching device 520 (and subsequently re-configured switching device 820) to function as a diode, as described with reference to FIG. 5, apply equally to the example in FIG. 8 and will accordingly not be discussed in detail.

In some examples, for example by following the flowchart of FIG. 6, the controller 524 may determine a short condition 832 exists on channel 314 and 316 and thus that the identified short condition 832 exists there between.

In some examples, therefore, detection of short circuits between, for example wheel speed sensor channels may be made. In some examples, such detection may be performed in a vehicle when the vehicle is in motion. In some examples, such detection of short circuits may increase safety of driving, by reducing or minimizing a potential for accidents due to an IC malfunction in the vehicle's electronics.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device.

Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A sensor circuit, comprising:
    at least one signal processing circuit connectable to at least one sensor operable on a channel and configured to receive and process a periodic sensor signal therefrom;
    a switching device coupled between the signal processing circuit and the at least one sensor;
    at least one switch coupled to the switching device; and
    a controller connected to the at least one switch and to an output of the signal processing circuit,
    wherein the controller is operable to re-configure the switching device via control of the at least one switch to perform a diode function, to control the at least one switch to couple a gate to a drain of the switching device to perform the diode function, and to determine whether a short condition exists on the at least one sensor or channel based on the output from the signal processing circuit.

2. The sensor circuit of claim 1, wherein the controller is operable to re-configure the switching device to change its impedance.

3. The sensor circuit of claim 1, wherein the at least one switch comprises a first switch connected between the gate and the drain and a second switch connected to the drain, such that the controller is operable to re-configure the switching device to perform the diode function by closing the first switch and opening the second switch.

4. A sensor circuit, comprising:
    at least one signal processing circuit connectable to at least one sensor operable on a channel and configured to receive and process a periodic sensor signal therefrom;
    a switching device coupled between the signal processing circuit and the at least one sensor;
    at least one switch coupled to the switching device; and
    a controller connected to the at least one switch and to an output of the signal processing circuit,
    wherein the controller is operable to re-configure the switching device via control of the at least one switch and to determine whether a short condition exists on the at least one sensor or channel based on the output from the signal processing circuit, and
        wherein the controller is operable to re-configure at least one further switching device via control of at least one further switch and determine whether the short condition exists between the at least one first sensor or first channel coupled to the switching device and at least one second sensor or second channel coupled to the at least one further switching device based on outputs from signal processing circuits coupled to both sensors.

5. A sensor circuit, comprising:
    at least one signal processing circuit connectable to at least one sensor operable on a channel and configured to receive and process a periodic sensor signal therefrom;
    a switching device coupled between the signal processing circuit and the at least one sensor;
    at least one switch coupled to the switching device; and
    a controller connected to the at least one switch and to an output of the signal processing circuit,
    wherein the controller is operable to re-configure the switching device via control of the at least one switch and to determine whether a short condition exists on the at least one sensor or channel based on the output from the signal processing circuit, and
    wherein the at least one signal processing circuit comprises at least one of:
        a current amplifier operably coupled to the at least one sensor via the switching device; and
        a comparator whose output is coupled to the controller and outputs a signal dependent upon an operation of the at least one sensor,
        wherein the controller determines whether the short condition exists on the at least one sensor or channel based on the output from the current amplifier or comparator.

6. The sensor circuit of claim 5, wherein the controller determines that the short condition does not exist by monitoring or receiving a sensor square wave from the current amplifier or comparator.

7. The sensor circuit of claim 5, wherein the controller determines that the short condition exists in response to a sustained logic zero signal from the comparator or no output from a current amplifier.

8. A sensor circuit, comprising:
    at least one signal processing circuit connectable to at least one sensor operable on a channel and configured to receive and process a periodic sensor signal therefrom;
    a switching device coupled between the signal processing circuit and the at least one sensor,
    at least one switch coupled to the switching device; and a controller connected to the at least one switch and to an output of the signal processing circuit, wherein the controller is operable to re-configure the switching device via control of the at least one switch to perform a diode function and to determine whether a short condition exists on the at least one sensor or channel based on the output from the signal processing circuit, and wherein the controller is arranged to compensate for the effect of a diode threshold voltage when re-configuring the switching device.

9. The sensor circuit of claim 1, wherein the at least one switch operably coupled to the controller performs selective re-configuration of the switching device.

10. The sensor circuit of claim 1, wherein the sensors are wheel speed sensors employed in a wheel speed sensor circuit.

11. The sensor circuit of claim 10, wherein the wheel speed sensors are applied to at least one from a group of: an anti-lock braking system, a traction control system.

12. The sensor circuit of claim 1, having an operational mode in which said sensors are operational, and a test mode in which said sensors are tested and wherein the test circuit and/or the controller are operable in said running mode and/or said test mode.

\* \* \* \* \*